United States Patent [19]

Ando

[11] Patent Number: 5,105,241
[45] Date of Patent: Apr. 14, 1992

[54] FIELD EFFECT TRANSISTOR
[75] Inventor: Yuji Ando, Tokyo, Japan
[73] Assignee: NEC Corporation, Tokyo, Japan
[21] Appl. No.: 723,664
[22] Filed: Jun. 26, 1991

Related U.S. Application Data

[63] Continuation of Ser. No. 630,542, Dec. 20, 1990, abandoned.

[30] Foreign Application Priority Data

Dec. 20, 1989 [JP] Japan .................... 1-332089

[51] Int. Cl.$^5$ .................................... H01L 29/80
[52] U.S. Cl. .................................... 357/22; 357/16; 357/15; 357/61; 357/89
[58] Field of Search .................. 357/16, 15, 22, 61, 357/89

[56] References Cited

U.S. PATENT DOCUMENTS 4,987,462 1/1991 Kim et al. .................... 357/22

OTHER PUBLICATIONS

Henderson et al., "Microwave Performance of a Quarter-Micrometer Gate Low-Noise Pseudomorphic . . . Transistor," IEEE Electron Device Letters, vol. ED-L-7, No. 12, Dec. 1986.

Primary Examiner—Edward J. Wojciechowicz
Attorney, Agent, or Firm—Burns, Doane, Swecker & Mathis

[57] ABSTRACT

In a filed effect transistor utilizing two-dimensional electron gas as an active layer, an improvement to increase sheet electron density in a cap layer has been made by inserting into the cap layer at an interface with a carrier supplying layer, a thin film comprising a material having an electron affinity larger than that of a material constituting the cap layer. Further by employing a non-doped material for this thin film layer, electron mobility in the cap layer can also be improved. Thus source resistance of the field effect transistor has been reduced.

5 Claims, 3 Drawing Sheets

FIELD EFFECT TRANSISTOR

This application is a continuation of application Ser. No. 07/630,542, filed Dec. 20, 1990, now abandoned

BACKGROUND OF THE INVENTION

1. Field of the Invention

The present invention relates to a structure of a field effect transistor making use of two-dimensional electron gas formed in a hetero-junction interface as an active layer (2DEGFET) and more particularly to a field effect transistor having an epitaxial layer structure which enables to enhance its performance.

2. Description of the Prior Art

An example of conventional 2DEGFET devices is shown in the attached FIG. 5 by a sectional view. Such 2DEGFET is reported for example in IEEE Electron Device Letters, Vol. EDL-7, No. 12 (1986), p 649 by Henderson, et al. In the FIG. 5, 1 denotes a semi-insulating (S.I.) GaAs substrate, 2 denotes a non-doped GaAs layer constituting a buffer layer, 3 denotes a channel layer comprising non-doped InGaAs and 4 denotes a carrier supplying layer constituted by an n-type AlGaAs layer. In the InGaAs layer 3, two-dimensional electron gas (2DEG) is induced to form a channel layer in the vicinity of the interface with the AlGaAs layer 4. On the AlGaAs layer 4, a cap layer 6 comprising an n-type GaAs is formed and, on this cap layer 6, a source electrode 7a and a drain electrode 7b are formed by evaporation to produce an ohmic contact with the 2DEG channel layer. Further, a gate electrode 8 is formed at a recess portion formed across the cap layer 6.

Heretofore, improvements of performances of 2DEGFET have been carried out mainly by shortening gate length and modififying construction of the epitaxial layer, but they now achieves maximum from the technical point of view. At present, essential problem for realizing low-noise and high-gain devices is how to reduce a parasitic resistance in a source electrode or a gate electrode.

Potential diagram of a conduction band in a hetero-interface $X_5$-$Y_5$ between the cap layer and the channel layer of 2DEGFET shown in FIG. 5 is shown in FIG. 6, from which it is understood that a path for electron flow is formed also in the cap layer 6 in parallel to the 2DEG channel layer 3. It is known that this second current path in the cap layer works as a bypass of the 2DEG channel layer and contributes to reduce the parasitic resistance of the device. The channel layer 3 and the cap layer 6 are connected by a tunnel current flowing through the AlGaAs layer 4. It is therefore considered that in such 2DEGFET, a source resistance is determined by a sheet resistance of the cap layer, a tunnel resistance, a sheet resistance of the channel layer and a contact resistance in the electrode portions. As long as 2DEG is used as a carrier, there is naturally a limitation to reduction of the sheet resistance of the channel layer. Further, the tunnel resistance and the contact resistance are considered to be determined by height of a potential barrier and so their control is not easy. On the other hand, the sheet resistance of the cap layer can easily be reduced by increasing a sheet electron density in the cap layer. Therefore, it has been tried to reduce the source resistance by increasing the thickness of the high density cap layer, up to now. In compound semiconductors having a small state density in a conductive band, however, there is naturally a limitation to the increase of the carrier density and, for example, in a case of GaAs, the carrier density reaches saturation at an extent of $5 \times 10^{18}$/cm$^3$. There is a limitation also to the thickness of the cap layer, since too thick cap layer will soon lose its good contact. As mentioned above, it has been difficult to sufficiently reduce the sheet resistance in the cap layer by the prior art.

SUMMARY OF THE INVENTION

An object of the present invention therefore is to realize a field effect transistor which has an epitaxial layer structure containing a cap layer having a low sheet resistance, by adding a simple modification to the cap layer.

The present invention thus provides a field effect transistor comprising first and second electrodes, semiconductor layers connected to these electrodes to form a carrier channel between them and a control electrode, said semiconductor layers consisting essentially of:

(a) a non-doped channel layer, (b) a carrier supplying layer which has an electron affinity smaller than that of said non-doped channel layer and contains an n-type impurity element as doped, and (c) a cap layer which is formed to have an electron affinity increasing in the vicinity of an interface with said carrier supplying layer and larger than that of said carrier supplying layer at the interface with said carrier supplying layer.

The above cap layer may be formed by a laminated structure comprising a first semiconductor layer of a first n-type semiconductor material having an electron affinity $X_1$ and a second semiconductor layer of a second n-type semiconductor material having an electron affinity $X_2$; said second semiconductor layer being formed in contact with said carrier supplying layer and said $X_1$ being smaller than $X_2$. It is possible to use an n-type GaAs layer and an n-type InGaAs layer respectively as the first and the second semiconductor layer.

Further, it is possible to realize high mobility by constituting the second semiconductor layer by a highly pure semiconductor material so that a two-dimensional electron gas layer may be formed therein. As for such semiconductor layer, it is possible to use an n-type GaAs layer as the first semiconductor layer and a non-doped InGaAs layer as the second semiconductor layer.

As shown in said FIG. 6, an electron accumulation layer is formed in the cap layer 6 in the vicinity of an interface with the carrier supplying layer 4. If a conduction band discontinuity ($\Delta$ Ec) in the interface between the cap layer and the carrier supplying layer can be increased, the accumulated charge in the cap interface is increased to reduce the sheet resistance of the cap layer. This can be realized by providing a semiconductor layer comprising a material having a larger electron affinity in the cap layer in the vicinity of the interface with the carrier supplying layer. Further, by forming the semiconductor layer having a larger electron affinity by a non-doped material, this layer will have a selectively doped double hetero-structure sandwiched between the carrier supplying layer and the n-type cap layer to form a 2DEG layer. As the result, this 2DEG flows in a non-doped semiconductor layer free from any impurities and so has a high mobility to contribute to reduce the sheet resistance of the cap layer as well as to improve the sheet electron density in the cap layer.

DESCRIPTION OF THE PREFERRED EMBODIMENTS

The present invention will be explained below further in detail with respect to its some embodiments.

Figure 1:
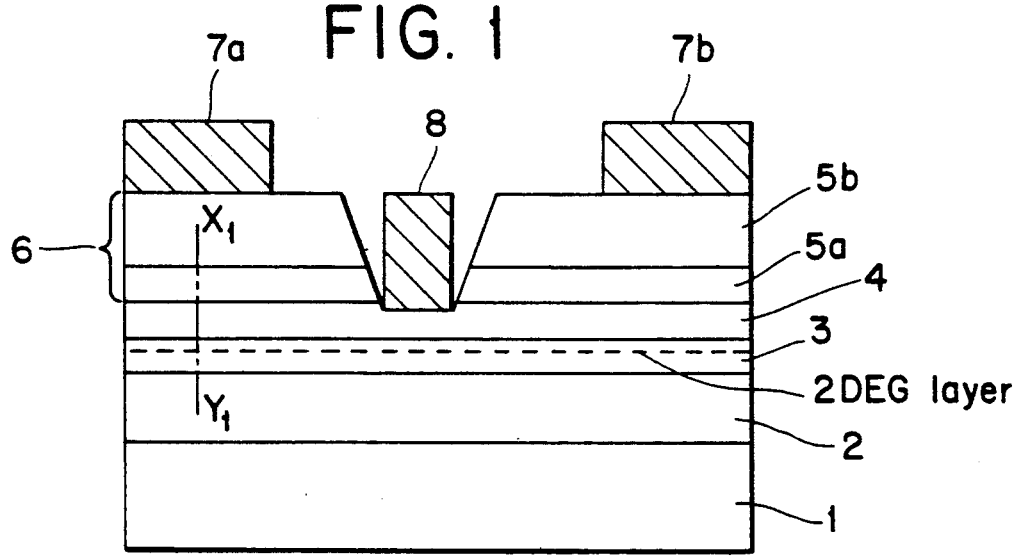
FIG. 1 and FIG. 3 show cross sectional views of embodiments of the field effect transistors of the present invention.
Figure 5:
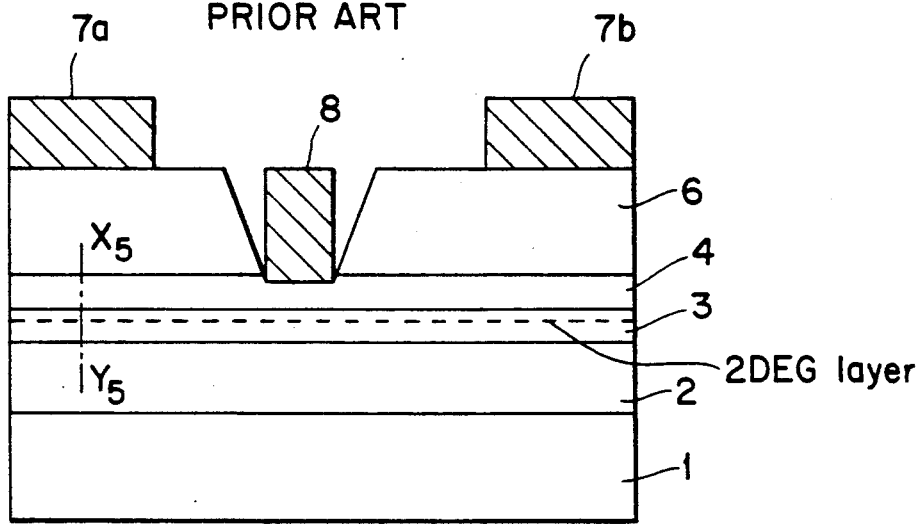
FIG. 5 shows a cross sectional view of a 2DEGFET according to the prior art and FIG. 6 shows a schematic illustration of a potential energy band among the cap layer, the electron supplying layer and the channel layer of the 2DEGFET of FIG. 5.
Figure 6:
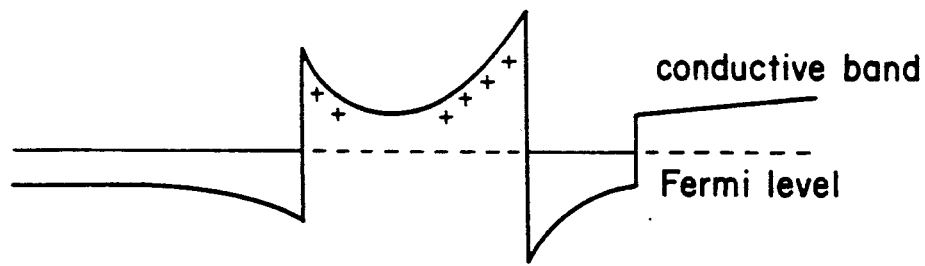
Figure 6:
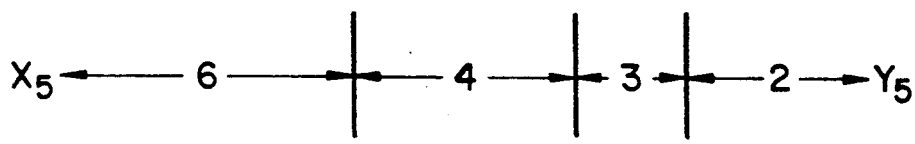

A 2DEGFET as one embodiment of the present invention shown in FIG. 1 has a substrate 1, a buffer layer 2, a channel layer 3, a carrier supplying layer 4, a cap layer 6, a source electrode 7a, a drain electrode 7b and a gate electrode 8 similarly to the 2DEGFET shown in FIG. 5. A feature of this embodiment is that the cap layer 6 comprises an n-type $In_{0.2}Ga_{0.8}As$ second semiconductor layer 5a, and an n-type GaAs first semiconductor layer 5b and an n-type InGaAs layer 5a is provided in the cap layer 6 in the vicinity of an interface with the n-type AlGaAs carrier supplying layer 4.

The device of this embodiment can be produced in the following manner. On a S.I. GaAs substrate 1, a non-doped GaAs buffer layer 2 of 1 $\mu$m thickness, a non-doped $In_{0.2}Ga_{0.8}As$ quantum well channel layer 3 of 100 Å thickness, an n-type $Al_{0.2}Ga_{0.8}As$ carrier supplying layer 4 of 300 Å thickness, an n-type $In_{0.2}Ga_{0.8}As$ second semiconductor layer 5a of 100 Å thickness and n-type GaAs first semiconductor layer 5b of 700 Å thickness are formed in this order by for example molecular-beam epitaxy (MBE). Although InGaAs and GaAs have different lattice constants, it is known that a good interface can be formed by reducing the thickness of $In_{0.2}Ga_{0.8}As$ layer to less than a critical film thickness for causing misfit dislocation (about 150 Å) so that a strain lattice layer wherein a lattice mismatch is accomodated as elastic strain may be formed. On the cap layer comprising the first semiconductor layer 5b and the second semiconductor layer 5a, a source electrode 7a and a drain electrode 7b are formed by evaporation and then ohmic contacts are formed by an alloy treatment. In a recess portion formed across the cap layer 6, a gate electrode 8 is formed.

Figure 2:
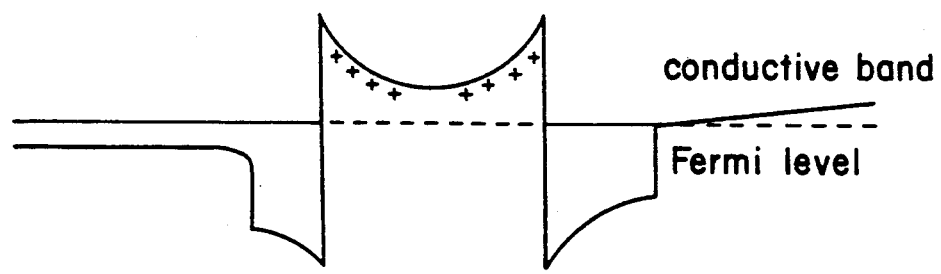
FIG. 2 and FIG. 4 respectively show schematic illustrations of potential energy bands among the cap layer, the electron supplying layer and the channel layer corresponding to the embodiments shown in FIG. 1 and FIG. 3.
Figure 2:
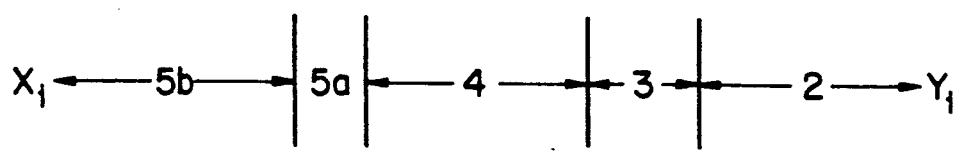

Potential diagram of a conduction band in a heterointerface $X_1$-$Y_1$ between the cap layer 6 and the channel layer 3 of 2DEGFET shown in FIG. 1 is shown in FIG. 2, from which it is understood that an electron accumulating layer is formed also in the n-type InGaAs layer 5a in parallel to the 2DEG channel layer 3. Since InGaAs has an electron affinity larger than that of GaAs, the amount of accumulated electrons in this n-type InGaAs layer becomes larger than that of the prior art cap layer solely of GaAs. For this, it becomes possible to increase the sheet carrier density of the cap layer in a simple manner and thus to contribute to reduce the source resistance.

Figure 3:
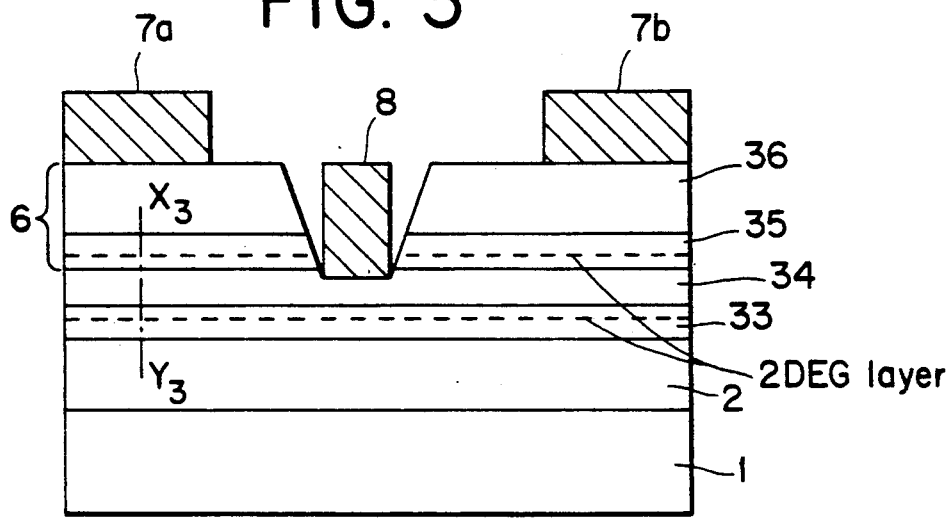

A 2DEGFET as another embodiment of the present invention is shown in FIG. 3, wherein reference numbers 1, 2, 6, 7a, 7b and 8 have same meanings as used in FIGS. 1 and 5. In this embodiment of FIG. 3, 34 means an n-type $Al_{0.25}Ga_{0.75}As$ carrier supplying layer and 33 and 35 both mean non-doped $In_{0.15}Ga_{0.85}As$ layers. A feature of this embodiment is that the non-doped InGaAs layer 35 is provided in the cap layer 6 in the vicinity of an interface with the n-type AlGaAs carrier supplying layer 34.

The device of this second embodiment can be produced in the following manner. On an S.I. GaAs substrate 1, a non-doped GaAs buffer layer 2 of 1 $\mu$m thickness, a non-doped $In_{0.15}Ga_{0.85}As$ quantum well channel layer 33 of 150 Å, thickness an n-type $Al_{0.25}Ga_{0.75}As$ carrier supplying layer 34 of 300 Å, thickness, a non-doped $In_{0.15}Ga_{0.85}As$ layer 35 of 200 Å thickness and an n-type GaAs layer 36 of 700 Å thickness are formed in this order by for example MBE. Film thickness of each of the $In_{0.15}Ga_{0.85}As$ layers 33 and 35 is made less than the critical film thickness to cause misfit dislocation (about 220 Å). On the cap layer 6 comprising the n-type GaAs layer 36 and the i-InGaAs layer 35, source electrode 7a and a drain electrode 7b are formed by evaporation and then ohmic contacts are formed by an alloy treatment. In a recess portion formed across the cap layer 6, a gate electrode 8 is formed.

Figure 4:
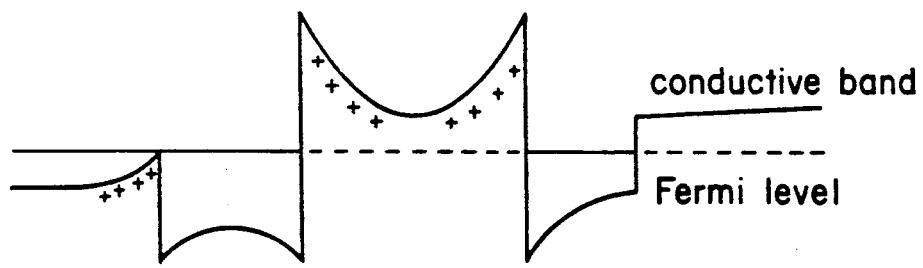
Figure 4:
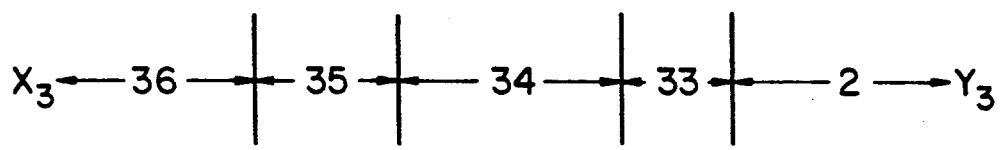

Potential diagram of a conduction band in a heterointerface $X_3$-$Y_3$ between the cap layer and the channel layer of 2DEGFET shown in FIG. 3 is shown in FIG. 4, from which it is understood that 2DEG layer is formed not only in the channel layer 33 but also in the non-doped InGaAs layer 35 having a double hetero selectively doped structure sandwiched between the n-type AlGaAs layer 34 and the n-type GaAs layer 36. Since InGaAs has an electron affinity larger than that of GaAs, the amount of accumulated electrons in the In-GaAs quantum well becomes larger than that of the prior art cap layer solely of GaAs. For this, it becomes possible to increase the sheet carrier density of the cap layer in a simple manner. Further, since electrons in the cap layer flow in the highly pure InGaAs layer which is free from any impurities and has small effective mass of electrons, it is considered that the sheet mobility of the cap layer can be extremely increased. Accordingly, and owing also to the improvement of sheet electron density, the source resistance can be much reduced.

In the above embodiments, the present invention has been explained with reference to 2DEGFET of AlGaAs/GaAs system, but it is to be noted that the present invention is not limited to such embodiments and is applicable to 2DEGFET of other systems such as AlInAs/GaInAs system, etc.

Further, although the cap layer is constituted by two layers of the GaAs layer and the InGaAs layer in the above embodiments, it is possible to employ a constitution of the cap layer having In content which gradually decreases as the distance from the interface with the carrier supplying layer increases. For example, in a case of 2DEGFET formed on an InP substrate, it is possible to use $In_{0.53}Ga_{0.47}As$ layer as the channel layer, $Al_{0.48}In_{0.52}As$ layer as the carrier supplying layer and $In_{0.53+x}Ga_{0.47-x}As$ layer as the cap layer; whereby the exceeding amount x of the In content being decreased from 0.15 to 0 as the distance from the carrier supplying layer increases.

As explained above in detail, it is understood that according to the present invention the sheet electron density in the cap layer can be increased by inserting into the cap layer at the interface with the carrier supplying layer, a thin film comprising a material having an electron affinity larger than that of material constituting the cap layer. Further by employing a non-doped material for this thin film layer, the electron mobility in the cap layer can also be improved. Thus it becomes possible to reduce the source resistance of 2DEGFET and improve the device performances.

I claim:

1. A field effect transistor comprising first and second electrodes, semiconductor layers connected to these electrodes to form a carrier channel between them and a control electrode, said semiconductor layers comprising:
   (a) a non-doped channel layer,
   (b) a carrier supplying layer which has an electron affinity smaller than that of said non-doped channel layer and contains an n-type impurity element as doped, and
   (c) a cap layer which is formed to have an electron affinity increasing in the vicinity of an interface with said carrier supplying layer and larger than that of said carrier supplying layer at the interface with said carrier supplying layer.

2. The field effect transistor according to the claim 1, wherein said cap layer is formed to have a laminated structure comprising a first semiconductor layer of a first n-type semiconductor material having an electron affinity X and a second semiconductor layer of a second n-type semiconductor material having an electron affinity $X_2$; said second semiconductor layer being formed in contact with said carrier supplying layer and said $X_1$ being smaller than $X_2$.

3. The field effect transistor according to the claim 1, wherein said cap layer is formed to have a laminated structure comprising a first semiconductor layer of a first n-type semiconductor material having an electron affinity $X_1$ and a second semiconductor layer of a second non-doped semiconductor material having an electron affinity $X_2$; said second semiconductor layer being formed in contact with said carrier supplying layer, said $X_1$ being smaller than $X_2$ and said second semiconductor layer having a two-dimensional electron gas layer formed therein.

4. The field effect transistor according to the claim 1, wherein said cap layer is formed to have an electron affinity gradually increasing toward the interface with said carrier supplying layer.

5. The field effect transistor according to the claim 4, wherein said cap layer is formed to have an In content which gradually decreases toward the interface with said carrier supplying layer.

* * * * *